(12) United States Patent
Lee et al.

(10) Patent No.: US 10,269,706 B2
(45) Date of Patent: Apr. 23, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/220,078

(22) Filed: Jul. 26, 2016

(65) Prior Publication Data
US 2018/0033727 A1   Feb. 1, 2018

(51) Int. Cl.
    H01L 23/528    (2006.01)
    H01L 21/768    (2006.01)
    H01L 21/8234   (2006.01)
    H01L 23/522    (2006.01)
    H01L 23/532    (2006.01)

(52) U.S. Cl.
    CPC .... *H01L 23/5283* (2013.01); *H01L 21/76804* (2013.01); *H01L 21/76816* (2013.01); *H01L 21/76877* (2013.01); *H01L 21/823475* (2013.01); *H01L 23/5226* (2013.01); *H01L 23/5329* (2013.01); *H01L 23/53223* (2013.01); *H01L 23/53238* (2013.01); *H01L 23/53252* (2013.01); *H01L 23/53266* (2013.01); *H01L 23/53295* (2013.01)

(58) Field of Classification Search
    None
    See application file for complete search history.

(56) References Cited

U.S. PATENT DOCUMENTS

| 8,030,777 | B1* | 10/2011 | van Schravendijk | H01L 21/76834 257/762 |
| 2002/0001939 | A1* | 1/2002 | Kinoshita | H01L 21/318 438/622 |
| 2008/0258303 | A1* | 10/2008 | Yeh | H01L 21/288 257/751 |
| 2013/0221524 | A1* | 8/2013 | Augur | H01L 23/53238 257/741 |
| 2013/0299988 | A1* | 11/2013 | Bonilla | H01L 21/76877 257/751 |
| 2014/0024211 | A1* | 1/2014 | Ott | H01L 23/5222 438/637 |
| 2014/0027822 | A1* | 1/2014 | Su | H01L 29/66545 257/288 |

(Continued)

OTHER PUBLICATIONS

Office Action dated Jul. 19, 2017 issued in Taiwanese Patent Application No. 105131073.

*Primary Examiner* — Khaja Ahmad
(74) *Attorney, Agent, or Firm* — McDermott Will & Emery LLP

(57) ABSTRACT

A semiconductor device includes a first interlayer dielectric (ILD) layer disposed over a substrate, and a first metal wiring pattern formed in the first interlayer dielectric layer and extending in a first direction parallel with the substrate. In a cross section along a second direction which crosses the first direction and is in parallel with the substrate, a top of the first metal wiring pattern is covered by a first two-dimensional material layer.

20 Claims, 11 Drawing Sheets

(56) References Cited

U.S. PATENT DOCUMENTS

| | | | |
|---|---|---|---|
| 2014/0145332 A1* | 5/2014 | Ryan | H01L 23/53238 |
| | | | 257/751 |
| 2014/0167268 A1 | 6/2014 | Bao et al. | |
| 2014/0235049 A1 | 8/2014 | Yang et al. | |
| 2015/0137377 A1* | 5/2015 | Bao | H01L 23/5226 |
| | | | 257/758 |
| 2015/0206842 A1* | 7/2015 | Saito | H01L 23/53276 |
| | | | 257/746 |
| 2015/0270225 A1 | 9/2015 | Yang et al. | |
| 2015/0303299 A1 | 10/2015 | Chang et al. | |
| 2017/0110538 A1* | 4/2017 | Nirmalraj | H01L 29/0665 |

* cited by examiner

SEMICONDUCTOR DEVICE AND MANUFACTURING METHOD THEREOF

TECHNICAL FIELD

The disclosure relates to semiconductor integrated circuits, more particularly to semiconductor devices having metal wiring structures with two-dimensional material layers and manufacturing processes thereof.

BACKGROUND

As the semiconductor industry introduces new generations of integrated circuits (ICs) having higher performance and greater functionality, multi-layer metal wiring structures disposed over the underlying electronic devices, such as transistors, have been employed. To meet requirements for a higher speed and more reliability, advanced metal wire forming methods and structures have been developed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1-13 are exemplary cross sectional views illustrating sequential processes for manufacturing a semiconductor device according to one embodiment of the present disclosure. FIGS. 1-13 illustrate exemplary sequential processes for fabricating one or more metal wiring layers (wiring levels), which are formed above a substrate. Although there are core structures such as transistors or other elements (e.g., contacts etc.) constituting the semiconductor device (hereinafter referred to as "underlying structures") between the substrate and the metal wiring layer(s), detailed illustrations of such elements are omitted in FIGS. 1-13 for simplicity. It is understood that additional operations can be provided before, during, and after processes shown by FIGS. 1-13, and some of the operations described below can be replaced or eliminated, for additional embodiments of the method. The order of the operations/processes may be interchangeable.

Figure 1:
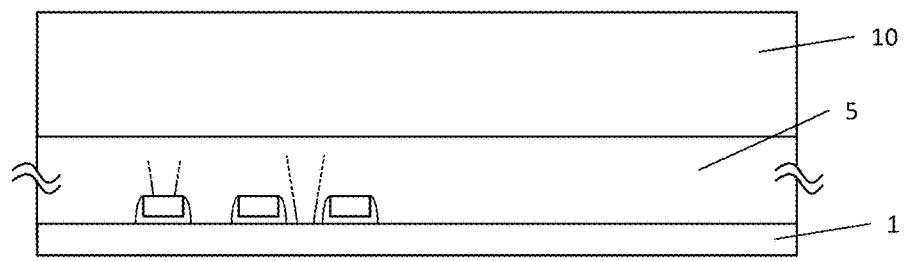
FIGS. 1-13 show exemplary cross sectional views illustrating sequential processes for manufacturing a semiconductor device according to one embodiment of the present disclosure.

As shown in FIG. 1, a first interlayer dielectric (ILD) layer 10 is formed over the underlying structures 5 disposed over the substrate 1. The underlying structures 5 include transistors, resistors, capacitors, local wirings, isolation layers and/or device isolation layers.

An interlayer dielectric layer may also be called an inter-metal dielectric (IMD) layer. The first ILD layer 10 is made of, for example, one or more layers of silicon oxide-based material, silicon nitride based material and low-k dielectric material. Low-k dielectric materials have a k-value (dielectric constant) lower than about 3.5. Some low-k dielectric materials have a k-value lower than about 3.5 and may have a k-value lower than about 2.5. The silicon oxide-based material includes silicon oxide, SiON, SiOC or SiOCN, SiCOH, and silicon nitride-based material includes silicon nitride, SiON, SiCN or SiOCN.

Organic material such as polymers may be used for the first ILD layer 10. For example, the first ILD layer 10 is made of one or more layers of a carbon-containing material, organo-silicate glass, a porogen-containing material, and/or combinations thereof. Nitrogen may also be included in the first ILD layer 10 in some embodiments. The first ILD layer 10 may be a porous layer. The density of the first ILD layer 10 is less than about 3 g/cm$^3$ in one embodiment and may be less than about 2.5 g/cm$^3$ in other embodiments. The first ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer may include an inter-layer insulating film and an inter-wire insulating film such that the metal wirings will be formed mainly in the inter-metal insulating film. The inter-layer insulating film may include a SiOC film and as the inter-wire insulating film may include a TEOS (tetraethylorthosilicate) film.

The operations to form the metal wiring patterns include a damascene process. In the damascene process, one or more layers of metal material are formed in the first recesses 15 and the upper surface of the first ILD layer 10, and a planarization operation such as a chemical mechanical polishing (CMP) method and/or a etch-back method is performed to remove portions of the metal material formed on the upper surface of the first ILD layer 10.

Figure 2:
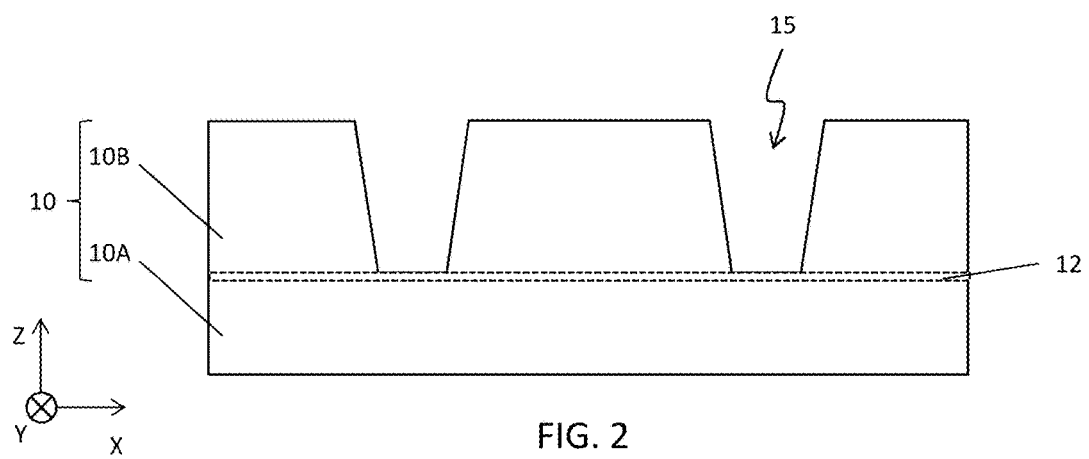

As shown in FIG. 2, first recesses 15 are formed in the first ILD layer 10 by using patterning operations including lithography and etching processes. In some embodiments, one or more via holes (contact holes) (not shown) to be connected to one or more elements of the underlying structures may be formed at the bottom of the first recesses. In some embodiments, the first recess 15 includes a lower portion as a via part and an upper portion as a wiring part extending in the Y direction, where the Z direction is a stacked direction (the normal direction of the substrate).

In some embodiments, an etch-stop layer 12 may be used so that the bottoms of the recesses 15 can be defined. In such a case, the first ILD layer 10 may include a lower first ILD layer 10A and an upper first ILD layer 10B with the etch-stop layer 12 being interposed therebetween. The materials for the lower first ILD layer 10A and the upper first ILD layer 10B may be the same or different. If an etch-stop layer is not used, the depth of the recess may be controlled by controlling an etching time or an etching rate of the recess etching.

Figure 3:
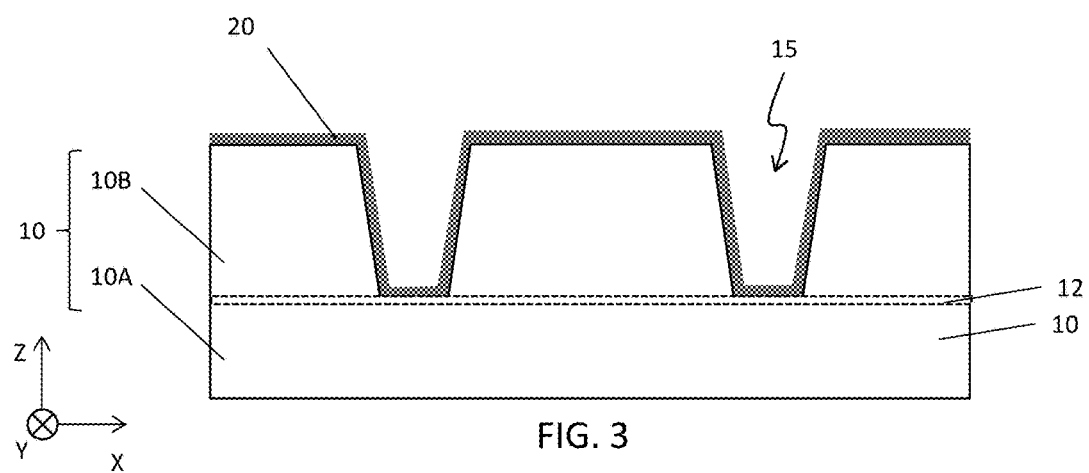

As shown in FIG. 3, a barrier layer 20 made of a conductive material is formed over the first ILD 10 and inside the recesses 15. The barrier layer 20 includes one or more layers of TiN, TaN and Ti. The thickness of the barrier layer 20 is in a range from about 0.5 nm to about 7 nm in some embodiments. The barrier layer 20 can be formed by chemical vapor deposition (CVD), physical vapor deposition (PVD) including sputtering, atomic layer deposition (ALD), electrode-less plating and/or electro-plating.

Figure 4:
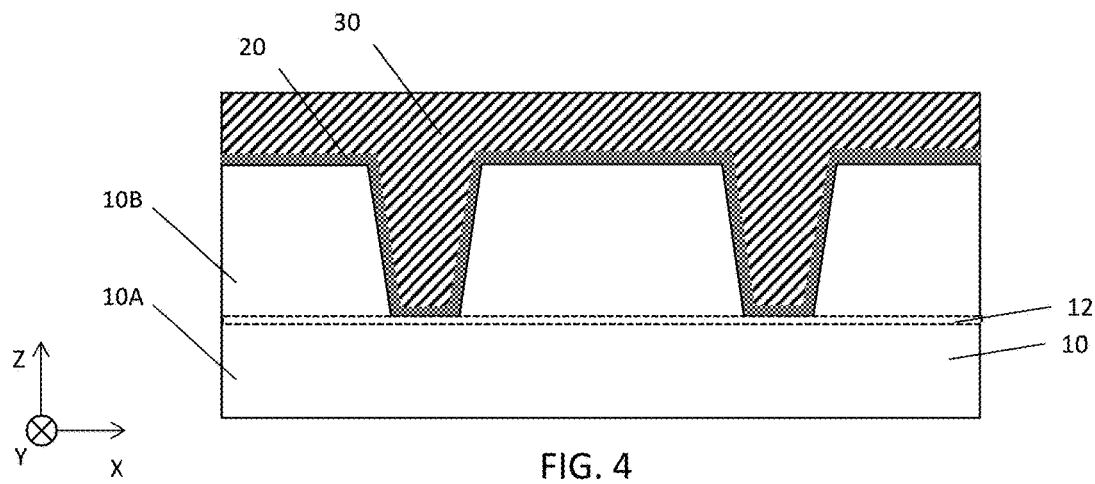

After the barrier layer 20 is formed, a metal layer 30 is formed, as shown in FIG. 4. The metal material for the metal layer 30 is one or more layers of Al, Cu, Co, Mn, W, Ni, Ti, Ta, Ru, Rh, Ir, Mo, or an alloy thereof, TiN, TaN, TiW, WN, TiAl, TiAlN, TaC, TaCN, NiSi and TiSiN. In one embodiment, the metal layer 30 includes Cu and an alloy of Cu (e.g., CuMn) or Ni.

Figure 5:
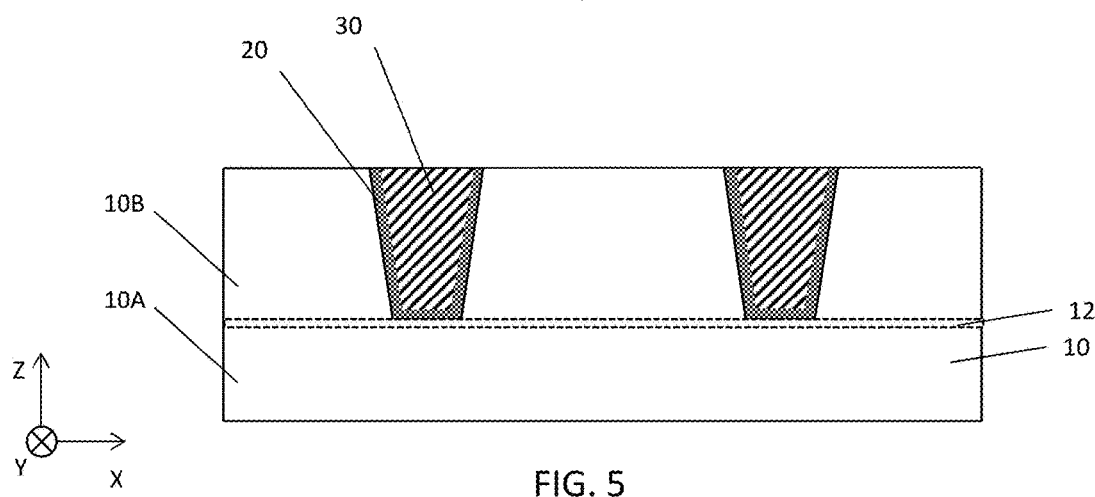

Subsequently, as shown in FIG. 5, the upper portions of the barrier layer 20 and the metal layer 30 disposed on the upper surface of the first ILD layer 10 are removed by CMP.

Figure 6:
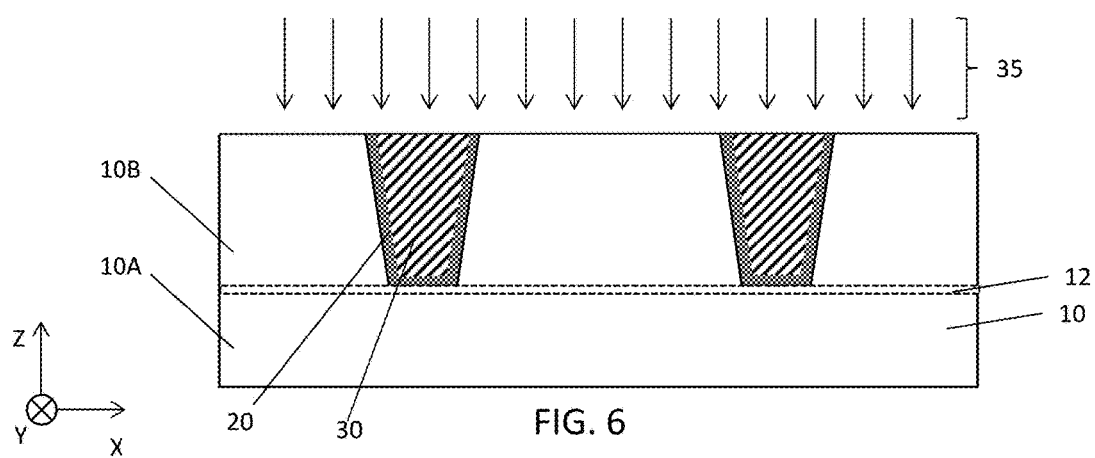

In some embodiments, as shown in FIG. 6, exposed surfaces of the metal layer 30 are physically and/or chemically treated. In certain embodiments, a plasma treatment 35 is performed over the upper surface of the first ILD layer 10 and the exposed surface of the metal layer 30. The plasma is generated with $H_2$ gas, $NH_3$ gas and/or Ar gas.

The plasma treatment 35 is applied to remove Cu oxide formed on the upper surface of the exposed metal layer 30 and promote a two-dimensional material, such as graphene, to be deposited easily. The plasma treatment 35 can also modify the surface of the first ILD layer 10 such that a graphene growth is suppressed on the surface of the first ILD layer 10. Accordingly, it is possible to selectively deposit graphene on the metal layer (Cu layer) 30 only. During the plasma treatment, the substrate temperature is maintained at a temperature in a range from about 25° C. (room temperature) to about 400° C. In some embodiments, the input power of the plasma is in a range from about 100 W to about 1000 W, and the pressure during the plasma treatment is in a range from about 0.1 Torr to about 50 Torr. The duration of the plasma treatment is in a range from about 3 sec to about 180 sec in certain embodiments.

The plasma treatment 35 may include single or multi-step processes, each of which contains hydrogen-based gas, ammonia-based gas or argon-based gas. In some embodiments, a self-assembled monolayer (SAM) (not shown) is formed on the surface of the first ILD layer, which can further suppress the deposition of the graphene layer. The SAM may be made of a silane-based material, a phosphate-based material, an amine-based material and/or a thiol-based material. The thickness of the SAM is in a range from about 2 nm to about 7 nm in some embodiments. The plasma treatment 35 may be omitted.

Figure 7:
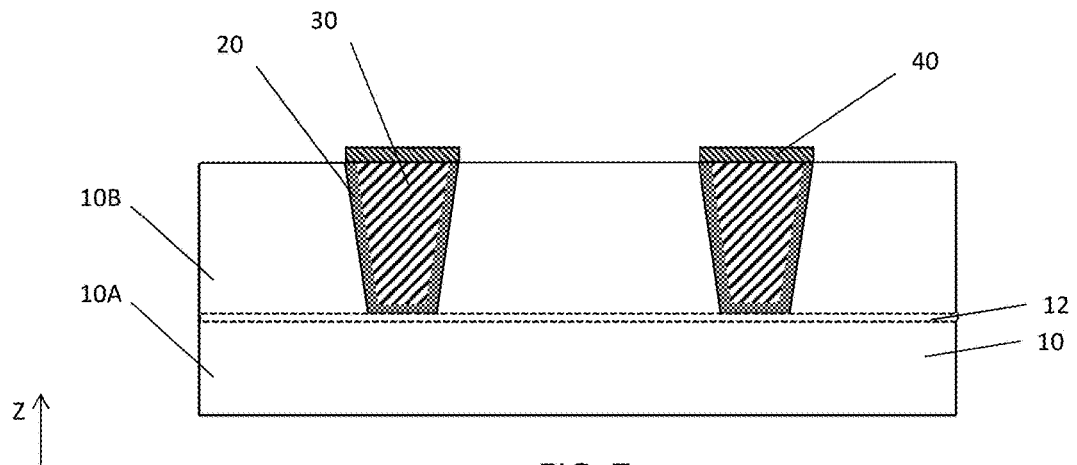

After the plasma treatment 35, a two-dimensional (2D) material layer 40 is selectively formed on the surface of the metal layer 30, as shown in FIG. 7. Two-dimensional materials are generally known as substances with a thickness of a few nanometers or less. In some embodiments, the 2D material layer 40 includes graphene based material, such as un-doped graphene, doped graphene and graphene oxide; transition metal dichalcogenide (TMD), such as $MoS_2$, $WS_2$ and $NbSe_2$; or BN.

In one embodiment, the 2D material layer 40 includes graphene. The graphene layer can be formed by thermal CVD or plasma CVD using one or more of methane gas, ethane gas, propane gas or other hydrocarbon gas, together with hydrogen gas. The graphene layer can be a monolayer or a multilayer structure. Since the underlying metal, such as Cu or Ni, functions as catalyst, the graphene layer can be selectively formed on the surface of the metal layer 30, as shown in FIG. 7. In some embodiments, the graphene layer is also formed on the barrier layer 20. During the graphene formation process, the substrate temperature is maintained at a temperature in a range from about 200° C. to about 750° C. in some embodiments and is maintained at a temperature in a range from about 250° C. to about 450° C. in other embodiments. In some embodiments, a wet formation process is employed.

When the 2D material is graphene oxide, a graphene oxide layer is formed by treating a graphite layer with an oxidizer or oxygen plasma. When the 2D material is TMD or BN, a 2D material layer is formed by CVD, PVD and/or ALD, and a patterning operation may be performed to form the 2D material layer 40 on the surface of the metal layer 30. Similar to the case of graphene, the Cu layer can function as a catalyst layer and TMD or BN can grow faster on the Cu surface than on the insulating material, and a TMD or BN layer can be selectively formed.

The thickness of the 2D material layer 40 is in a range from about 0.3 nm to about 2 nm in some embodiments.

Figure 8:
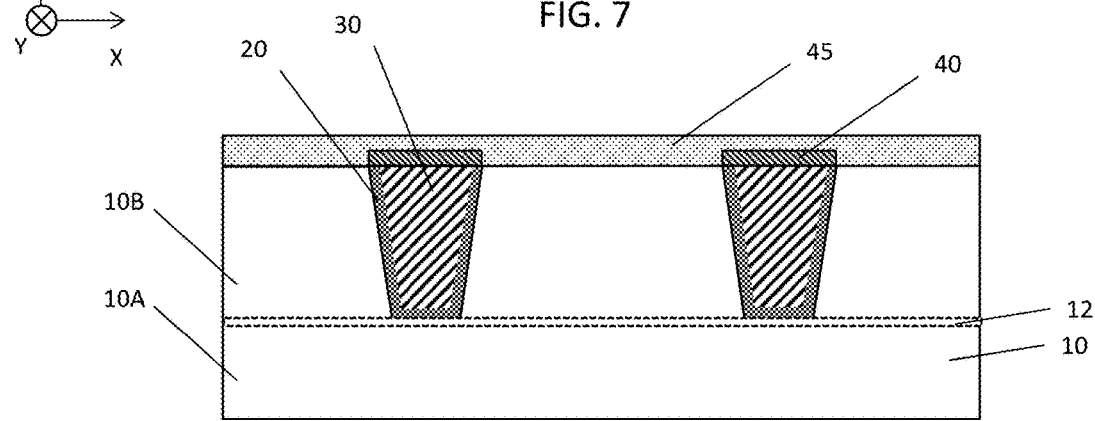

After the 2D material layer 40 is formed, an etching-stop layer (ESL) 45 is formed to cover the 2D material layer 40 and the surface of the first ILD layer 10, as shown in FIG. 8. The ESL 45 includes one or more layers of silicon nitride based insulating material. In one embodiment, SiN formed by CVD is used as the ESL 45. The thickness of the ESL 45 is in a range from about 5 nm to about 15 nm in some embodiments. The ESL 45 may be omitted.

Figure 9:
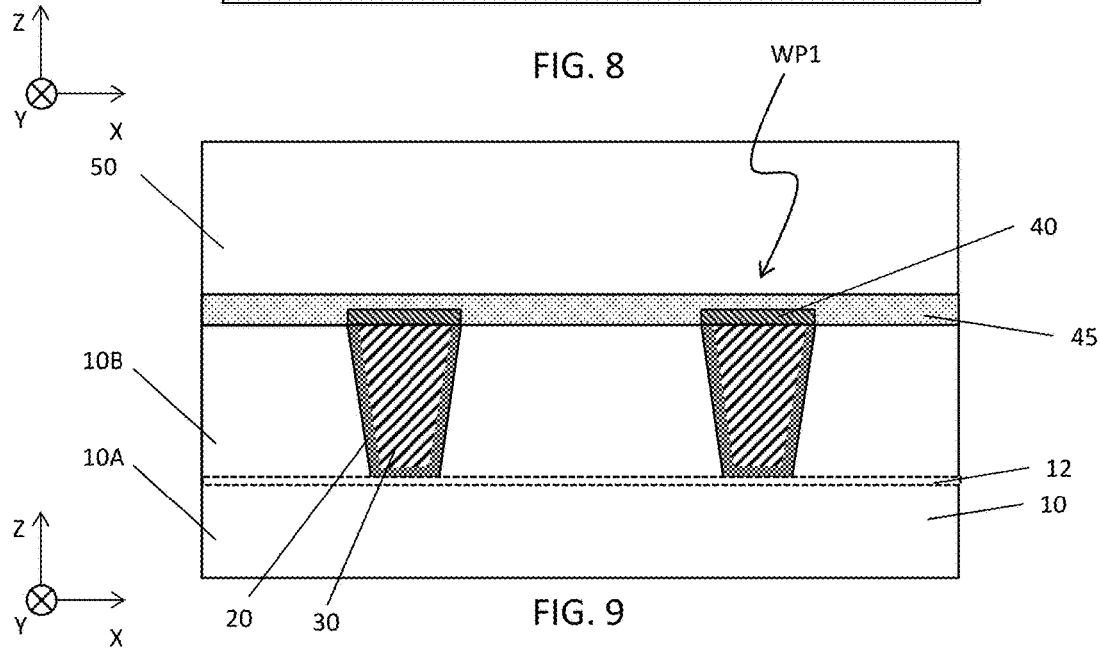

Subsequently, a second ILD layer 50 is formed on the ESL 45, as shown in FIG. 9. The second ILD layer 50 can be formed by the same processes as the first ILD layer 10.

As shown in FIG. 9, in a cross section along the X direction, a top of the metal wiring pattern WP1 is covered by the 2D material layer 40, and at least one of sides and bottom of the metal wiring pattern WP1 is covered by the barrier layer 20 made of a conductive material different from the 2D material layer 40. In one embodiment, the both sides and bottom of the metal wiring pattern WP1 are covered by barrier layer 20.

Figure 10:
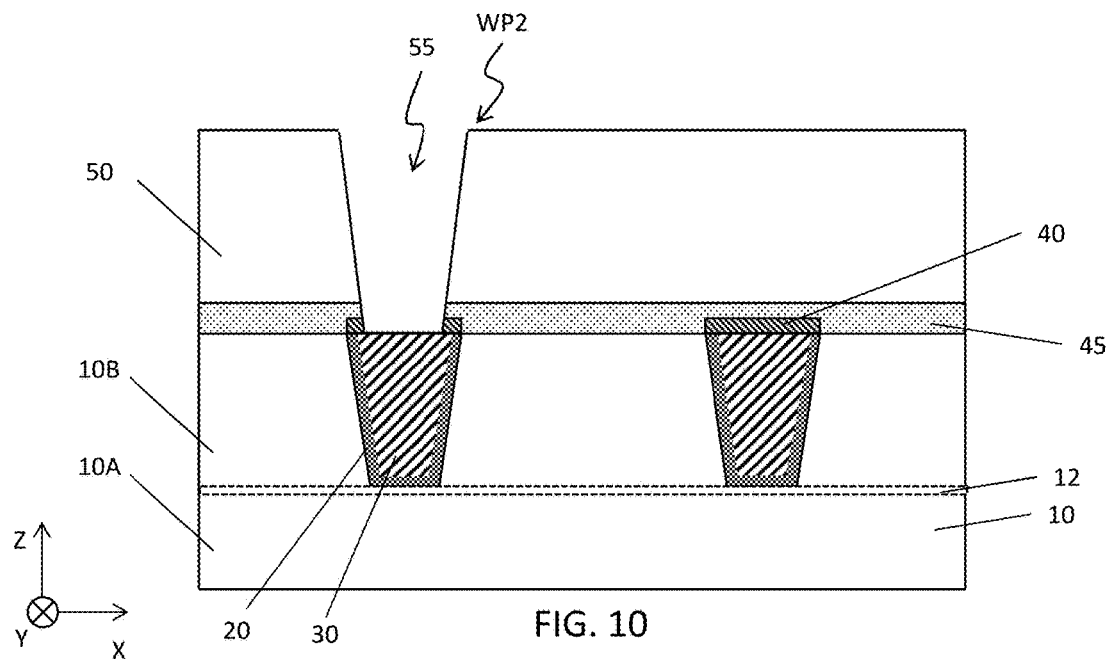

Subsequently, an upper metal layer is formed on the metal wiring pattern. As shown in FIG. 10, an opening 55 is formed in the second ILD layer 50 and the ESL 45, for manufacturing metal wiring pattern WP2.

Figure 11:
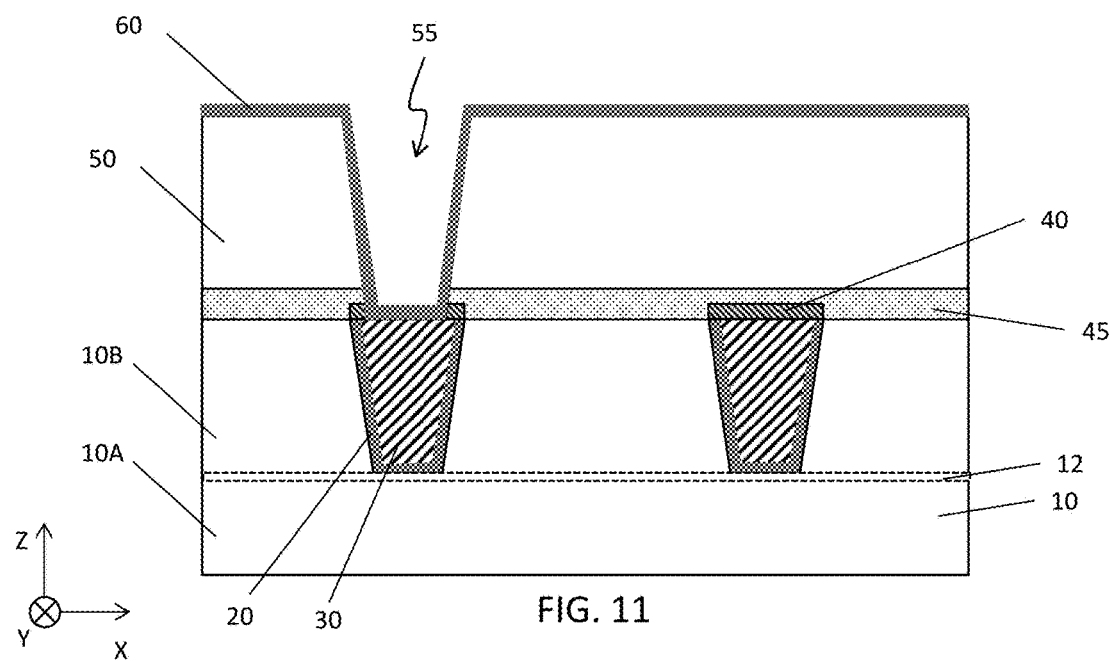

Then, as shown in FIG. 11, a second barrier layer 60 made of a conductive material is formed over the second ILD layer 60 and inside the opening 55. The second barrier layer 60 can be formed by the similar process as barrier layer 20. The thickness of the second barrier layer 60 is in a range from about 2 nm to about 7 nm in some embodiments.

Figure 12:
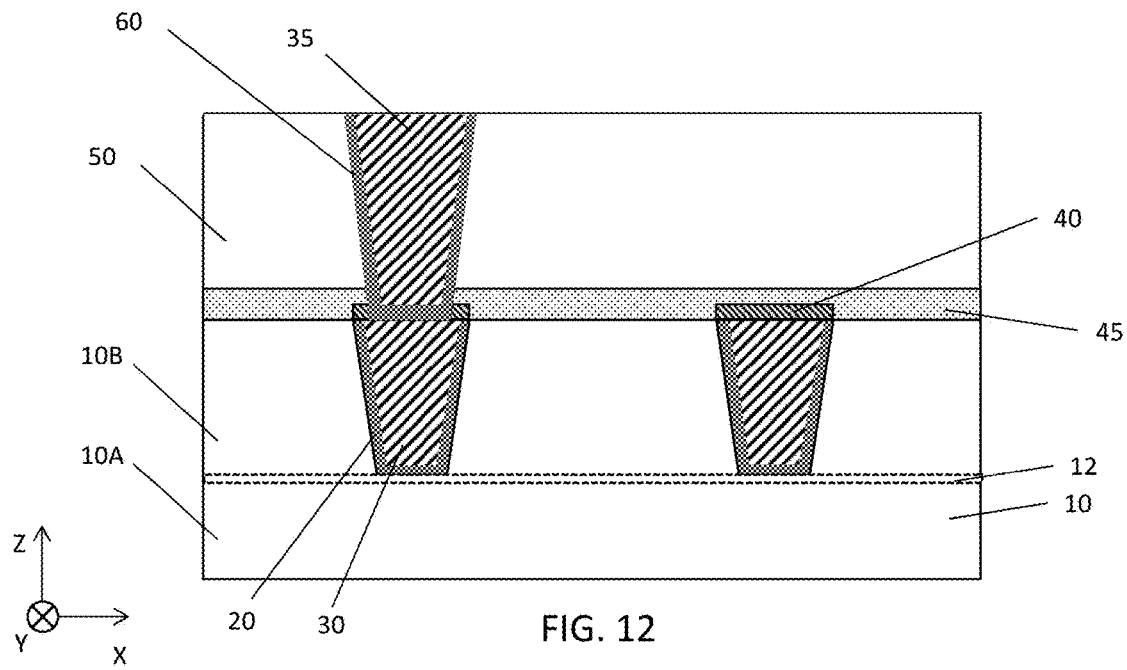

After the barrier layer 60 is formed, a second metal layer is formed, and the upper portions of the barrier layer 60 and the second metal layer disposed on the upper surface of the second ILD layer 10 are removed by CMP, as shown in FIG. 12. The second metal layer 35 can be formed by similar processes as the metal layer 30.

Further, by using similar operations with respect to FIGS. 6 and 7, a second 2D material layer 70 is formed on the upper surface of the second metal layer 35.

Figure 13:
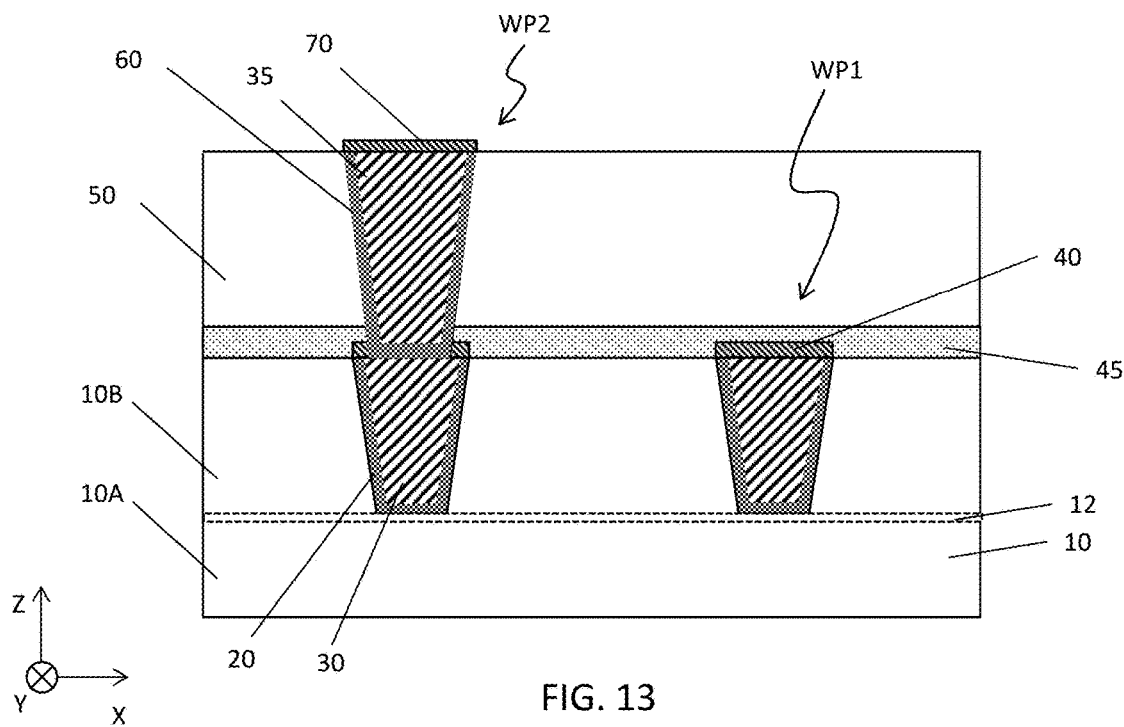

As shown in FIG. 13, in a cross section along the X direction, a top of the metal wiring pattern WP2 is covered by the 2D material layer 70, and at least one of sides and bottom of the metal wiring pattern WP2 is covered by barrier layers 20 or 60. In one embodiment, the 2D material remains at the upper surface of the lower metal layer 30.

Subsequently, a third ILD layer and a second ESL may be formed over the wiring pattern WP2.

FIGS. 14-17 show exemplary cross sectional views illustrating sequential processes for manufacturing a semiconductor device according to another embodiment of the present disclosure. Similar or the same configurations, processes, materials and/or structures as set forth above with respect to FIGS. 1-13 may be employed in the following embodiment, and the detailed explanation may be omitted. It is understood that additional operations can be provided before, during, and after processes shown by FIGS. 14-17, and some of the operations described below can be replaced or eliminated, for additional embodiments of the method. The order of the operations/processes may be interchangeable.

In the embodiments of FIGS. 1-13, a conductive material, such as TiN, is used as the barrier layers. In the following embodiments, a 2D material layer is used as a barrier layer before forming a metal layer, such as a Cu layer.

Figure 14:
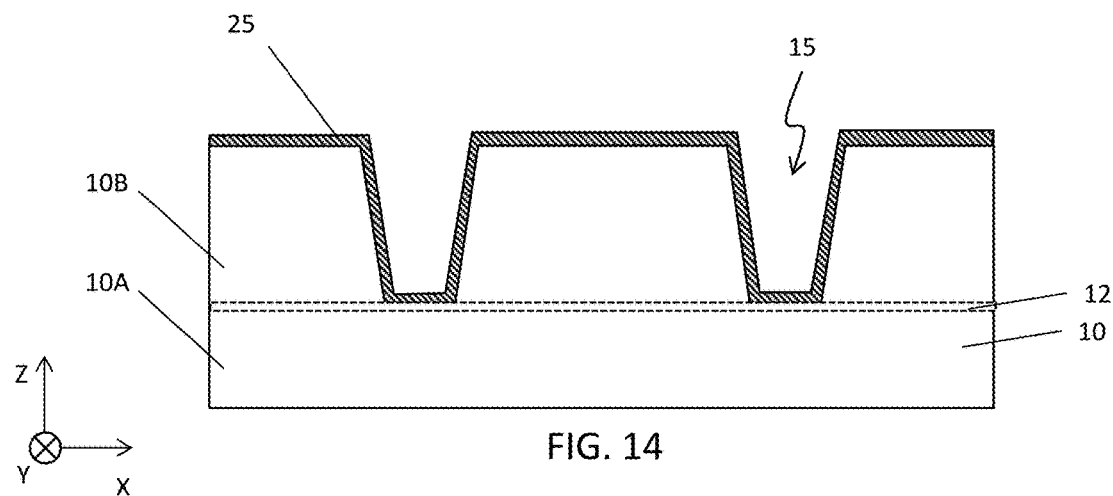
FIGS. 14-17 show exemplary cross sectional views illustrating sequential processes for manufacturing a semiconductor device according to another embodiment of the present disclosure.

After the recesses 15 are formed as shown in FIG. 2, a 2D material layer 25 is formed over the first ILD layer 10 and inside the recesses 15, as shown in FIG. 14.

In one embodiment, the 2D material layer 25 includes graphene. The graphene layer can be formed by thermal CVD or plasma CVD using one or more of methane gas, ethane gas, propane gas or other hydrocarbon gas, together with hydrogen gas. The graphene layer can be a monolayer or a multilayer structure. In this operation for forming the graphene, the substrate temperature is adjusted so that the graphene is formed without a catalyst, and thus the graphene layer can be formed over the first ILD layer 10 and inside the recesses 15, as shown in FIG. 14.

Other 2D materials, such as TMD or BN, formed by CVD, PVD and/or ALD can be used as the 2D material layer 25.

The thickness of the 2D material layer 25 is in a range from about 0.3 nm to about 5 nm in some embodiments.

Figure 15:
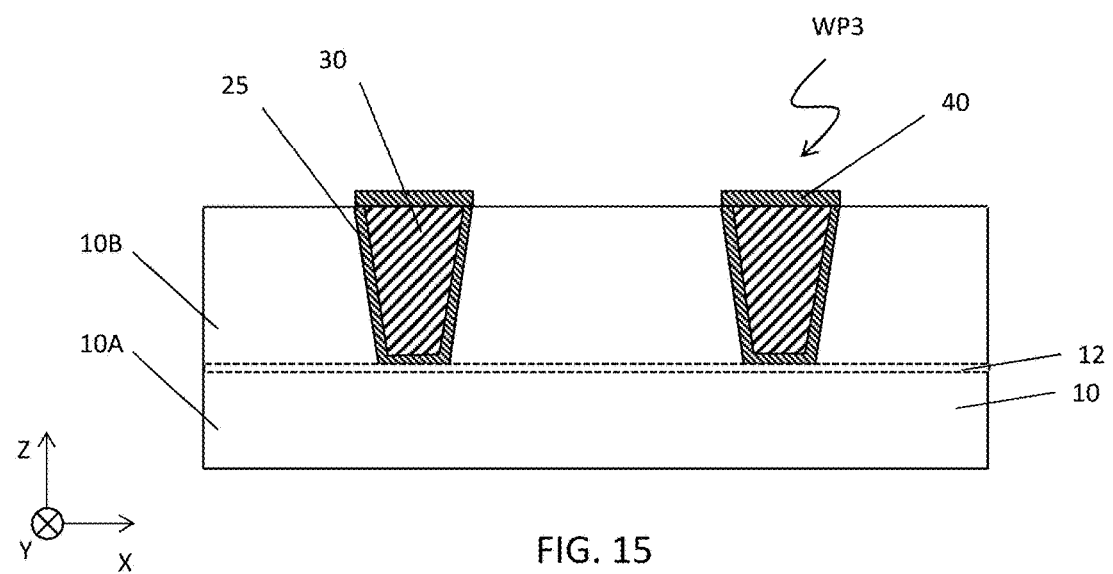

After the barrier layer 25 using a 2D material layer is formed, by performing the same or similar operations with respect to FIGS. 4-7, the 2D material layer 40 is formed on the surface of the metal layer 30, as shown in FIG. 15.

As shown in FIG. 15, in a cross section along the X direction, a top of the metal wiring pattern WP3 is covered by a 2D material layer 40, and at least one of sides and bottom of the metal wiring pattern WP3 is also covered by a 2D material 25. The 2D material layer 25 may be the same as or different from the 2D material layer 40. In one embodiment, both sides and the bottom of the metal wiring pattern WP3 are covered by 2D material layers.

Figure 16:
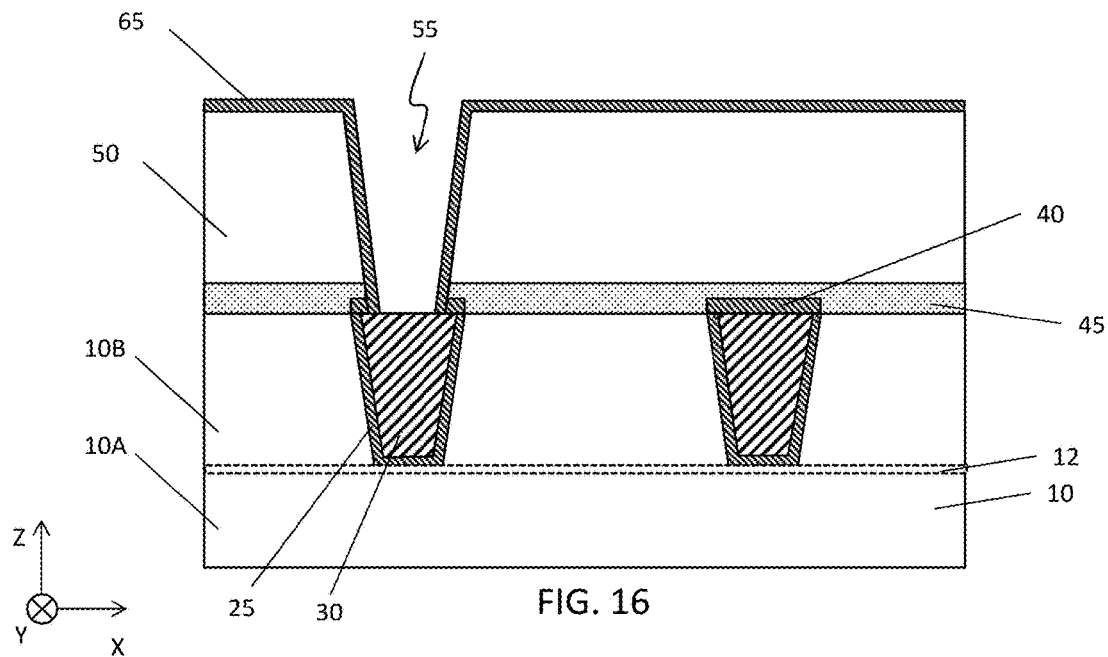

Subsequently, by performing the same or similar operations with respect to FIGS. 8-10, an opening 55 is formed in the second ILD layer 50 and the ESL 45. Further, as shown in FIG. 16, a second 2D material layer 65 as a second barrier layer is formed. The second 2D material layer 65 may be the same as or different from the 2D material layers 25 and/or 40.

In one embodiment, the second 2D material layer 65 is made of graphene, and the graphene layer 65 can be selectively formed on a surface of the second ILD layer 50 (i.e., an insulating material layer). By adjusting the deposition conditions (e.g., temperature), it is possible to differentiate deposition rates of graphene on a metal surface and a dielectric surface (e.g., a deposition rate on the dielectric surface being faster than a deposition rate on the metal surface), thereby achieving a selective deposition of graphene on the second ILD layer 50.

The thickness of the second 2D material layer 65 is in a range from about 0.3 nm to about 5 nm in some embodiments.

Figure 17:
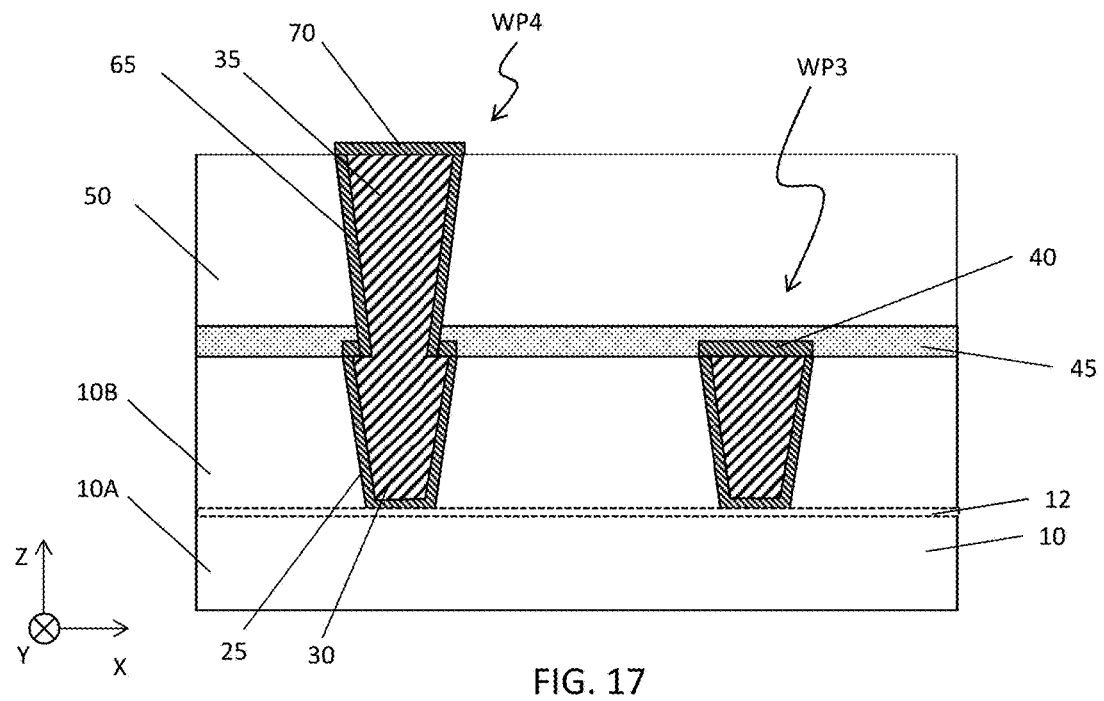

Then, by performing the same or similar operations with respect to FIGS. 12 and 13, the metal wiring pattern WP4 is formed as shown in FIG. 17. The 2D material layer 70 may be the same as or different from the 2D material layers 25, 40 and/or 65.

As shown in FIG. 17, in a cross section along the X direction, a top of the metal wiring pattern WP4 is covered by a 2D material layer 70, and at least one of sides and bottom of the metal wiring pattern WP4 is also covered by 2D material layers 25 or 65. In one embodiment, both sides and the bottom of the metal wiring pattern WP4 are covered by 2D material layers.

Subsequently, a third ILD layer and a second ESL may be formed over the wiring pattern WP4.

FIGS. 18-23 show cross sectional views illustrating sequential processes for manufacturing a semiconductor device according to another embodiment of the present disclosure. Similar or the same configurations, processes, materials and/or structures as set forth above with respect to FIGS. 1-17 may be employed in the following embodiment, and the detailed explanation may be omitted. It is understood that additional operations can be provided before, during, and after processes shown by FIGS. 18-23, and some of the operations described below can be replaced or eliminated, for additional embodiments of the method. The order of the operations/processes may be interchangeable.

Figure 18:
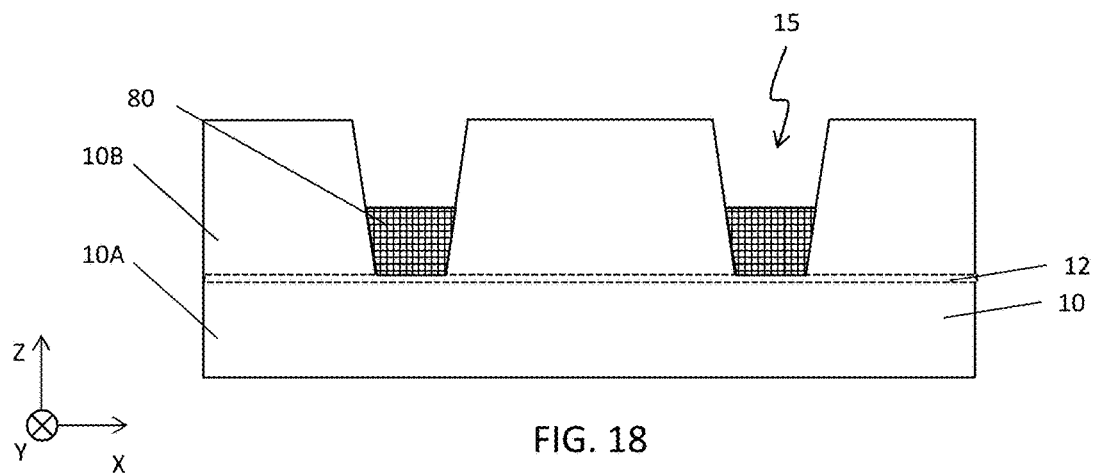
FIGS. 18-23 show cross sectional views illustrating sequential processes for manufacturing a semiconductor device according to another embodiment of the present disclosure.

After the recesses 15 are formed as shown in FIG. 2, lower portions of the recesses are filled with a conductive material 80 as shown in FIG. 18. The conductive material includes one or more layers of Co, Cu, Ru, W, Ni, Ti, TiN, Ta, TaN or silicide. The conductive material can be partially filled in the recess by using a selective electro-less plating method or a selective CVD method. The conductive material layer 80 may include a barrier layer (not shown) and a body conductive layer.

When the recess 15 has a via portion and a wire portion, the via portion is filled with the conductive material 80.

When the recess 15 is a via hole or a wiring pattern, the recess is filled to the level about 40% to about 60% of the depth of the via hole.

In certain embodiments, the via portion is formed by a damascene process and an additional ILD layer is formed over the via portion. Then, a recess 15 is formed in the additional ILD to expose the upper surface of the via portion.

Figure 19:
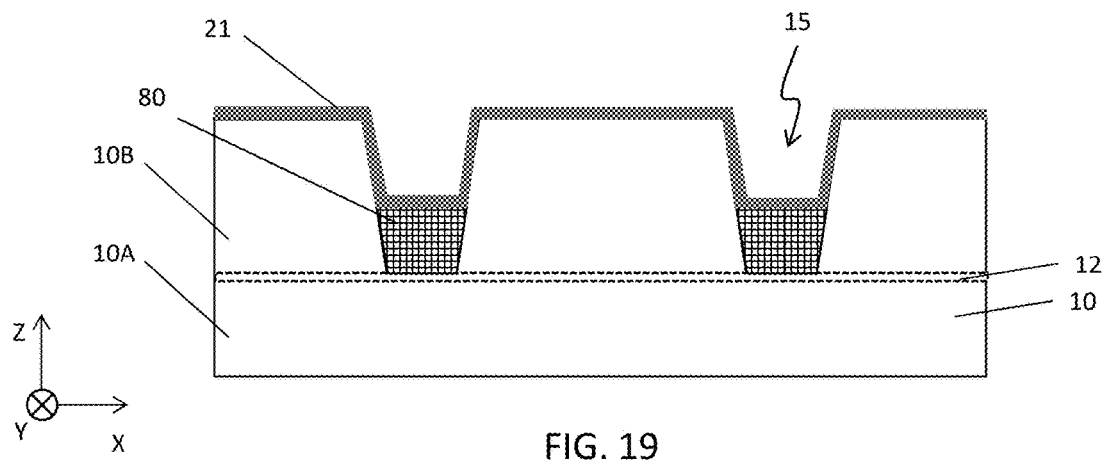

Then, similar to FIG. 3, a barrier layer 21 is formed as shown in FIG. 19.

Figure 20:
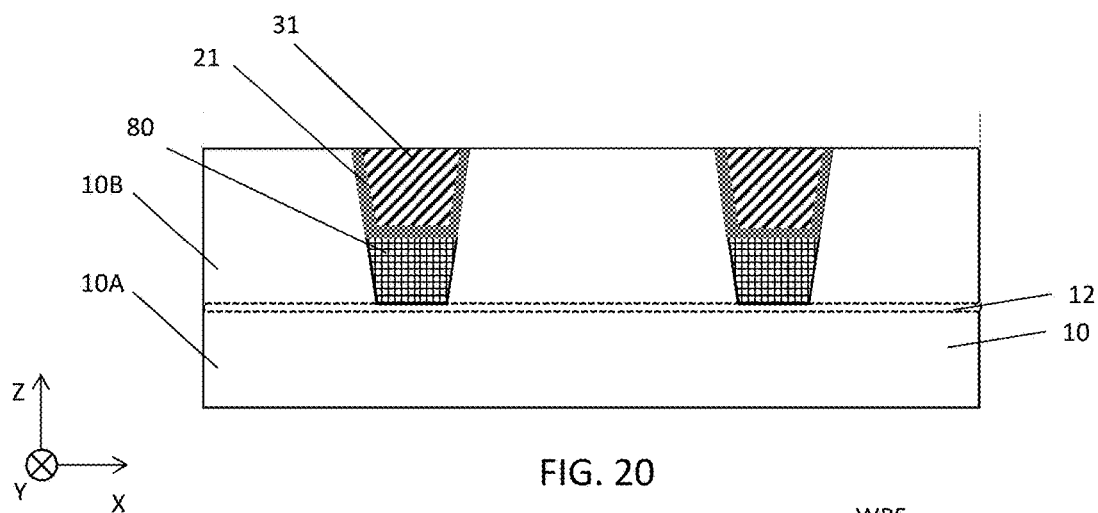

Subsequently, by the same or similar operations with respect to FIGS. 4 and 5, the upper portions of the recesses 15 are filled with a metal layer 31, as shown in FIG. 20.

Figure 21:
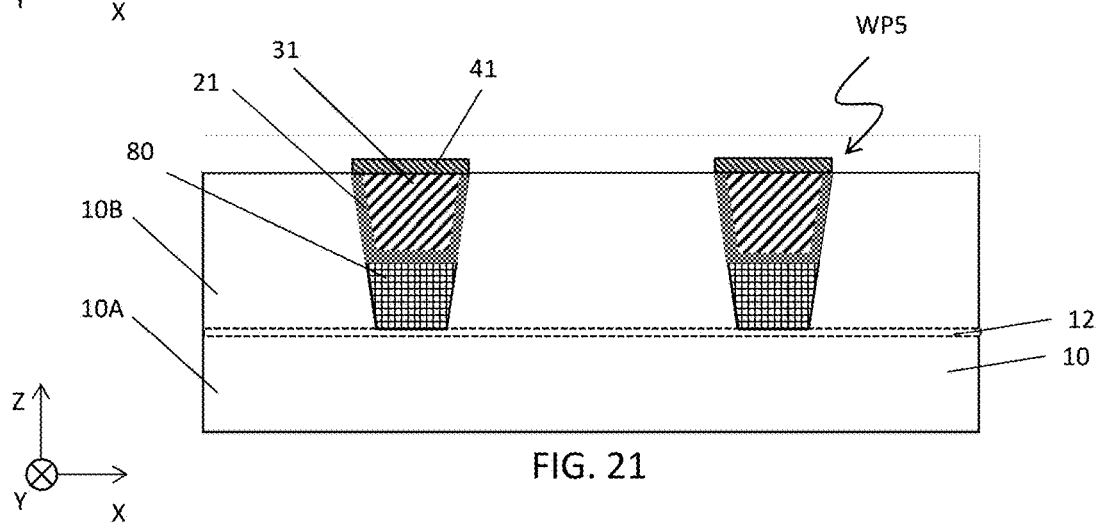

Then, by the same or similar operations with respect to FIGS. 6 and 7, a 2D material layer 41 is formed on the upper surface of the metal layer 31, as shown in FIG. 21.

As shown in FIG. 21, the wiring pattern WP5 includes a lower portion made of a conductive material and an upper portion. In the cross section along the X direction, a top of the upper portion is covered by the 2D material layer 41, and at least one of the sides and bottom of the upper portion is covered by the barrier layer 21 made of a conductive material different from the 2D material layer 41. In one embodiment, both sides and the bottom of the upper portion are covered by barrier layer 21.

Figure 22:
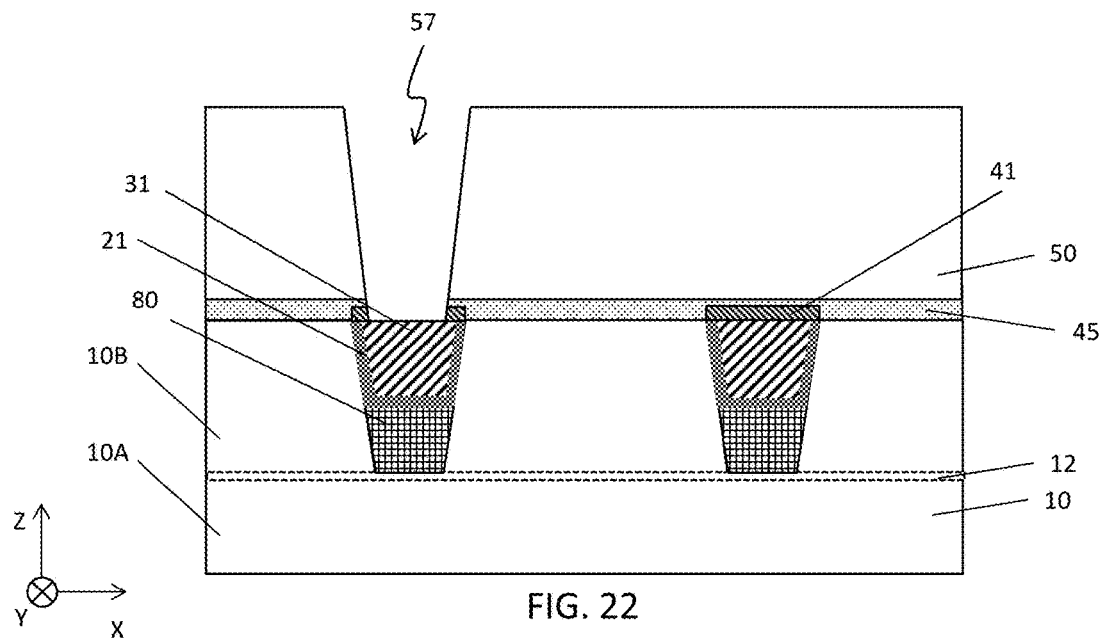

Subsequently, similar to FIGS. 8-10, an opening 57 is formed in the second ILD layer 50 and the ESL 45, as shown in FIG. 22. Then, the bottom portion of the opening 57 is filled with a conductive material 85, similar to FIG. 18, and the second barrier layer 61 and the second metal layer 36 are formed similar to FIGS. 19 and 20. Further, a second 2D material layer 71 is formed as shown in FIG. 23.

Figure 23:
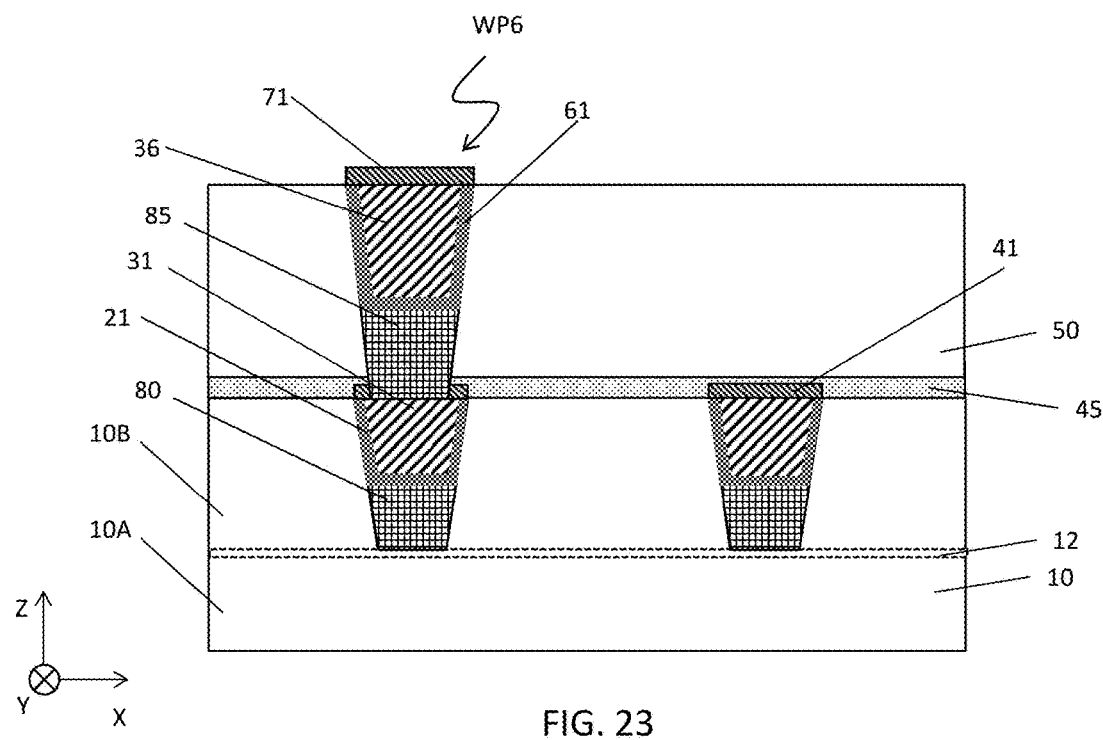

As shown in FIG. 23, the wiring pattern WP6 has a lower wiring pattern and an upper wiring pattern, each including a lower portion made of a conductive material and an upper portion. In the cross section along the X direction, a top of the upper portion of the upper wring pattern is covered by the 2D material layer 71, and at least one of the sides and the bottom of the upper portion thereof is covered by barrier layer 61 made of a conductive material different from the 2D material layer 71. In one embodiment, both sides and the bottom of the upper portion are covered by barrier layer 61. The 2D material layer 41 may be the same as or different from the 2D material layer 61.

In some embodiments, either one of the lower wiring pattern and the upper wiring pattern of the wiring pattern WP6 has the same or similar structure as the wiring patterns WP1 or WP3.

Subsequently, a third ILD layer and a second ESL may be formed over the wiring pattern WP6.

Figure 24:
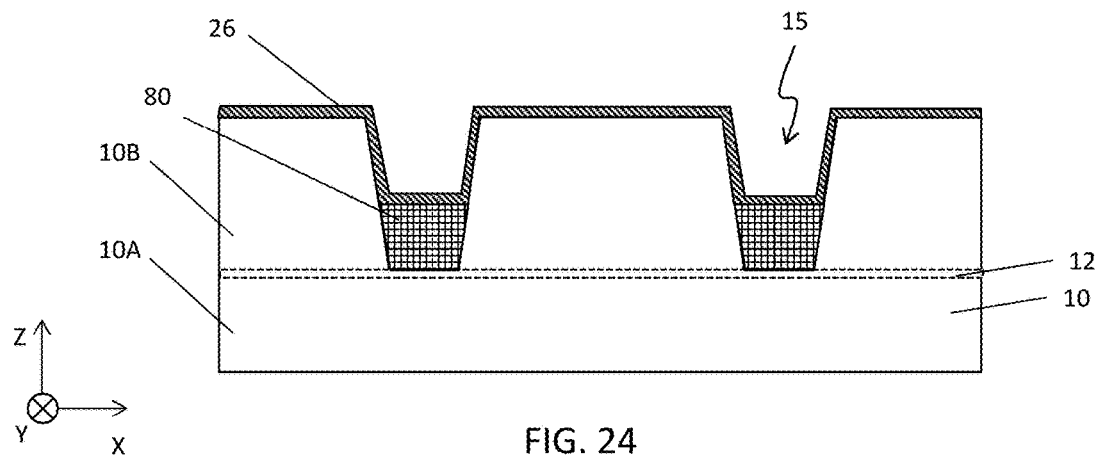
FIGS. 24-25 show cross sectional views illustrating sequential processes for manufacturing a semiconductor device according to another embodiment of the present disclosure.
Figure 25:
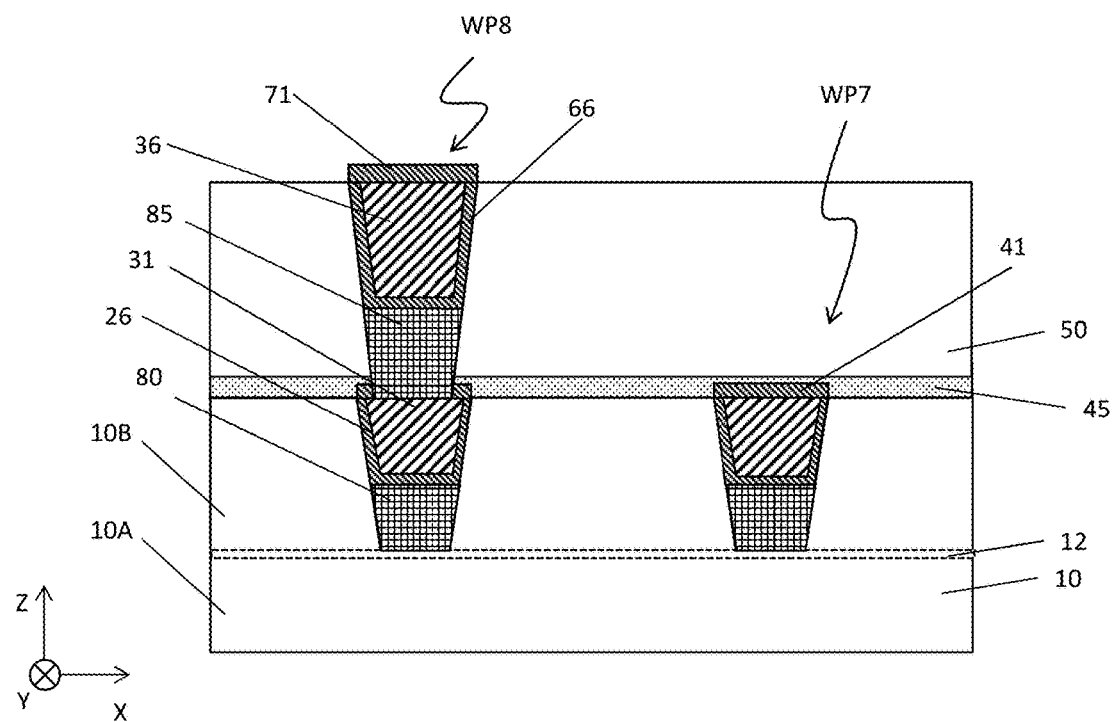

FIGS. 24-25 show cross sectional views illustrating sequential processes for manufacturing a semiconductor device according to another embodiment of the present disclosure. Similar or the same configurations, processes, materials and/or structures as set forth above with respect to FIGS. 1-23 may be employed in the following embodiment, and the detailed explanation may be omitted. It is understood that additional operations can be provided before, during, and after processes shown by FIGS. 24-25, and some of the operations described below can be replaced or eliminated, for additional embodiments of the method. The order of the operations/processes may be interchangeable.

After the lower portions of the recesses 15 are filled as shown in FIG. 18, a 2D material layer 26 is conformally (non-selective manner) formed as a barrier layer, as shown in FIG. 24. In this deposition operation, since the conductive material filled on the recesses 15 does not function as a catalyst, the 2D material layer 26 can be formed on the ILD 10B and the conductive layer 80.

Then, the metal layer 31 is formed similar to FIG. 20 and the 2D material layer 41 is formed on the surface of the metal layer 31, similar to FIG. 21. Subsequently, similar to FIGS. 22-23, an opening is formed in the second ILD layer 50 and the ESL 45, and then, the bottom portion of the opening is filled with a conductive material.

The, as a second barrier layer, a second 2D material layer 66 is formed similar to FIG. 24, and the second metal layer 36 are formed. Further, a second 2D material layer 71 is formed as shown in FIG. 25.

As shown in FIG. 25, the wiring pattern WP7 includes a lower portion made of a conductive material and an upper portion. In the cross section along the X direction, a top of the upper portion is covered by a 2D material layer 41, and at least one of the sides and the bottom of the upper portion is covered by a 2D material layer 26. The 2D material layer 26 and the 2D material layer 41 may be the same or different from each other. In one embodiment, both sides and the bottom of the upper portion are covered by 2D material layers.

Further, as shown in FIG. 25, the wiring pattern WP8 has a lower wiring pattern and an upper wiring pattern, each including a lower portion made of a conductive material and an upper portion. In the cross section along the X direction, a top of the upper portion of the upper wring pattern is covered by a 2D material layer 71, and at least one of the sides and the bottom of the upper portion thereof is covered by a 2D material layer 66. In one embodiment, both sides and the bottom of the upper portion are covered by the 2D material layer 66. The 2D material layer 71 may be the same as or different from the 2D material layers 26, 41 and/or 61.

In some embodiments, either one of the lower wiring pattern and the upper wiring pattern of the wiring pattern WP8 has the same or similar structure as the wiring patterns WP1, WP3 or WP5.

Subsequently, a third ILD layer and a second ESL may be formed over the wiring pattern WP8.

The various embodiments or examples described herein offer several advantages over the existing art. For example, in the present disclosure, since a two dimensional material layer covers at least on the surface of a metal wiring layer (e.g., a Cu layer), it is possible to reduce surface scattering at the metal wiring layer and to reduce resistivity (e.g., a line resistivity). Further, it is possible to increase a maximum current density in the metal wiring layer.

It will be understood that not all advantages have been necessarily discussed herein, no particular advantage is required for all embodiments or examples, and other embodiments or examples may offer different advantages.

In accordance with one aspect of the present disclosure, a semiconductor device includes a first interlayer dielectric (ILD) layer disposed over a substrate, and a first metal wiring pattern formed in the first interlayer dielectric layer and extending in a first direction parallel with the substrate. In a cross section along a second direction which crosses (e.g., perpendicular to) the first direction and is in parallel with the substrate, a top of the first metal wiring pattern is covered by a first two-dimensional material layer.

In accordance with another aspect of the present disclosure, a semiconductor device includes a first interlayer dielectric (ILD) layer disposed over a substrate, a first metal wiring pattern formed in the first interlayer dielectric layer and extending in a first direction parallel with the substrate, a second ILD layer disposed over the first ILD layer and the first metal wiring pattern, and a second metal wiring pattern formed in the second interlayer dielectric layer and connected to the first metal wiring pattern. In a cross section along a second direction, which crosses (e.g., perpendicular to) the first direction and is in parallel with the substrate, a top of the second metal wiring pattern is covered by a first two-dimensional material layer.

In accordance with another aspect of the present disclosure, in a method of manufacturing a semiconductor device, a first interlayer dielectric layer is formed over a substrate. A first recess is formed in the first interlayer dielectric layer. A metal wiring pattern is formed in the first recess. A two-dimensional material layer is formed on a top of the metal wiring pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first interlayer dielectric (ILD) layer disposed over a substrate;
   a first metal wiring pattern formed in the first interlayer dielectric layer and extending in a first direction parallel with the substrate;
   a second ILD layer disposed over the first ILD layer and the first metal wiring pattern; and
   a second metal wiring pattern formed in the second ILD layer and connected to the first metal wiring pattern, wherein:
   in a cross section along a second direction which crosses the first direction and is in parallel with the substrate, a top of the first metal wiring pattern is at least partially covered by a first two-dimensional material layer,
   wherein in the cross section, sides and bottom of the first metal wiring pattern are covered by a second two-dimensional material layer,
   wherein the first and second two-dimensional material layers are single layers of two-dimensional material,
   the first two-dimensional material layer is disposed only over the first metal wiring pattern,
   the first and second metal wiring patterns include Cu, and
   the second metal wiring pattern passes through the first two-dimensional material layer and is in direct contact with a Cu surface of the first metal wiring pattern.

2. The semiconductor device of claim 1, wherein the first two-dimensional material layer includes graphene.

3. The semiconductor device of claim 1, wherein the first two-dimensional material layer includes transition metal dichalcogenide (TMD).

4. The semiconductor device of claim 3, wherein the TMD includes one of $MoS_2$, $WS_2$ and $NbSe_2$.

5. The semiconductor device of claim 1, wherein the first two-dimensional material layer includes BN.

6. The semiconductor device of claim 1, wherein in the cross section, sides and bottom of the first metal wiring pattern are covered by a barrier metal layer made of a conductive material different from the first two-dimensional material layer.

7. The semiconductor device of claim 1, wherein in the cross section, sides and bottom of the first metal wiring pattern are covered by a second two-dimensional material layer made of a two-dimensional material different from the first two-dimensional material layer.

8. A semiconductor device, comprising:
   a first interlayer dielectric (ILD) layer disposed over a substrate;
   a first metal wiring pattern formed in the first interlayer dielectric layer and extending in a first direction parallel with the substrate;
   a second ILD layer disposed over the first ILD layer and the first metal wiring pattern; and
   a second metal wiring pattern formed in the second ILD layer and connected to the first metal wiring pattern, wherein:
   in a cross section along a second direction, which crosses the first direction and is in parallel with the substrate, a top of the second metal wiring pattern is fully covered by a first two-dimensional material layer,
   wherein the first two-dimensional material layer covering the top of the second metal wiring pattern only covers the second metal wiring pattern,
   the first two-dimensional material layer is a single layer of two-dimensional material,
   wherein in the cross section, sides and bottom of the first metal wiring pattern are covered by the first two-dimensional material layer,
   the first and second metal wiring patterns include Cu, and
   the first two-dimensional material layer is in direct contact with a Cu surface of the second metal wiring pattern,
   in the cross section, a part of a top of the first metal wiring pattern is covered by a second two-dimensional material layer, and the second metal wiring pattern passes through the second two-dimensional material layer and is in direct contact with a Cu surface of the first metal wiring pattern, and
   the second two-dimensional material layer covering the top of the first metal wiring pattern only covers the first metal wiring pattern.

9. The semiconductor device of claim 8, wherein the first two-dimensional material layer includes graphene.

10. The semiconductor device of claim 8, wherein the first two-dimensional material layer includes transition metal dichalcogenide (TMD).

11. The semiconductor device of claim 10, wherein the TMD includes one of $MoS_2$, $WS_2$ and $NbSe_2$.

12. The semiconductor device of claim 8, wherein the first two-dimensional material layer includes BN.

13. The semiconductor device of claim 8, wherein a material of the first two-dimensional material layer is same as a material of the second two-dimensional material layer.

14. The semiconductor device of claim 8, wherein in the cross section, sides of the second metal wiring pattern, and sides and bottom of the first metal wiring pattern are covered by barrier metal layer made of a conductive material different from the first two-dimensional material layer.

15. A method of manufacturing a semiconductor device, comprising:
   forming a first interlayer dielectric layer over a substrate;
   forming a first recess in the first interlayer dielectric layer;
   forming a first two-dimensional material layer over sidewalls of the first recess;
   forming a first metal wiring pattern over the first two-dimensional material layer in the first recess;
   removing a metal oxide layer on an upper surface of the first metal wiring pattern, wherein the metal oxide layer is a metal oxide of the first metal wiring pattern;

forming a second two-dimensional material layer on a top of the first metal wiring pattern, wherein the first and second two-dimensional material layers are single layers of two-dimensional material, and the two-dimensional material layer disposed on a top of the first metal wiring is disposed only over the first metal wiring pattern;

partially removing the two-dimensional material layer to partially expose the upper surface of the first metal wiring pattern;

forming a second interlayer dielectric layer over the first interlayer dielectric layer and the first metal wiring pattern; and forming a second metal wiring pattern in the second interlayer dielectric layer connected to the first metal wiring pattern.

16. The semiconductor device of claim 1, wherein a thickness of the first two-dimensional material layer ranges from about 0.3 nm to about 5 nm.

17. The semiconductor device of claim 8, wherein a thickness of the first two-dimensional material layer ranges from about 0.3 nm to about 5 nm.

18. The method of claim 15, wherein a thickness of the two-dimensional material layer ranges from about 0.3 nm to about 5 nm.

19. The method according to claim 15, wherein the two-dimensional material layer includes graphene or BN.

20. The method according to claim 15, wherein the two-dimensional material layer includes a transition metal dichalcogenide (TMD).

\* \* \* \* \*